(12) United States Patent
Mistretta et al.

(10) Patent No.: US 7,049,816 B2
(45) Date of Patent: May 23, 2006

(54) MAGNETIC RESONANCE IMAGING WITH DUAL VELOCITY ENCODED PROJECTION RECONSTRUCTION ACQUISITION

(75) Inventors: Charles A. Mistretta, Madison, WI (US); Kevin Michael Johnson, Hartland, WI (US); Tianliang Gu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 10/955,816

(22) Filed: Sep. 30, 2004

(65) Prior Publication Data
US 2006/0066306 A1    Mar. 30, 2006

(51) Int. Cl.
*G01V 3/00* (2006.01)
(52) U.S. Cl. .................... 324/306; 324/309
(58) Field of Classification Search ............ 324/306, 324/307, 309; 600/419
See application file for complete search history.

(56) References Cited

U.S. PATENT DOCUMENTS

| | | | |
|---|---|---|---|
| 5,031,624 A * | 7/1991 | Mistretta et al. ............ 600/419 |
| 5,226,418 A * | 7/1993 | Bernstein et al. ............ 600/419 |
| 5,408,180 A * | 4/1995 | Mistretta et al. ............ 324/306 |
| 5,432,447 A | 7/1995 | Song | |
| 5,783,942 A | 7/1998 | Bernstein et al. | |
| 6,188,922 B1 | 2/2001 | Mistretta et al. | |
| 6,310,479 B1* | 10/2001 | Zhu et al. ............ 324/312 |
| 6,487,435 B1 | 11/2002 | Mistretta et al. | |
| 6,703,835 B1 | 3/2004 | Patch et al. | |
| 6,954,067 B1* | 10/2005 | Mistretta ............ 324/307 |

FOREIGN PATENT DOCUMENTS

WO    WO 03/042711 A1    5/2003

OTHER PUBLICATIONS

Acrian T. Lee et al, Three-Point Phase-Contrast Velocity Measurements With Increased Velocity-To-Notice Ratio, MRM 33:122-125 (1995).
T. Gu et al, Phase Contrast 3D Flow Spectrum Acquisition Using VIPR, Proc. Intl. Soc. Mag. Reson. Med. 10 (2002).

* cited by examiner

*Primary Examiner*—Louis Arana
(74) *Attorney, Agent, or Firm*—Quarles & Brady LLP

(57) ABSTRACT

A phase contrast image is produced using a 3D projection reconstruction pulse sequence. A high velocity-to-noise image is produced by using a LOW VENC motion encoding gradient. Phase wrap errors caused by high velocity flow is corrected using phase information in a HIGH VENC image produced from highly undersampled data acquired during the same scan.

9 Claims, 7 Drawing Sheets

MAGNETIC RESONANCE IMAGING WITH DUAL VELOCITY ENCODED PROJECTION RECONSTRUCTION ACQUISITION

STATEMENT REGARDING FEDERALLY SPONSORED RESEARCH

This invention was made with government support under Grant No. HL072260 awarded by the National Institute of Health. The United States Government has certain rights in this invention.

BACKGROUND OF THE INVENTION

The field of the invention is nuclear magnetic resonance ("NMR") imaging methods and systems. More particularly, the invention relates to the acquisition of NMR images indicative of flow, or motion.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal B1 is terminated, this signal may be received and processed to form an image.

When utilizing these signals to produce images, magnetic field gradients (Gx Gy and Gz) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The prevailing methods used to acquire NMR signals and reconstruct images use a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., Physics in Medicine and Biology, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient (Gy) along that direction, and then a spin-echo signal is acquired in the presence of a readout magnetic field gradient (Gx) in a direction orthogonal to the phase encoding direction. The readout gradient present during the spin-echo acquisition encodes spatial information in the orthogonal direction. In a typical 2DFT pulse sequence, the magnitude of the phase encoding gradient pulse Gy is incremented ($\Delta$Gy) in the sequence of views that are acquired during the scan to produce a set of NMR data from which an entire image can be reconstructed.

To increase the rate at which image frames are acquired, image quality may be sacrificed by acquiring fewer phase encoding views, or by using faster pulse sequences that inherently result in lower quality images. With the spin-warp methods, therefore, there is a trade-off between the number of views that are acquired to achieve the desired image resolution and quality, and the rate at which NMR data for a complete image may be acquired.

Magnetic resonance angiography (MRA) uses nuclear magnetic resonance (NMR) phenomenon to produce images of the human vasculature. Two basic MRA techniques have been proposed and evaluated. The first class, time-of-flight (TOF) techniques, consists of methods which exploit the differences in signal saturation that exist between flowing blood and stationary tissue. Flowing blood, which is moving through the excited section, is continually refreshed by spins experiencing fewer excitation pulses and is, therefore, less saturated. This effect is magnified by injecting a contrast agent into the patient and timing the acquisition when the contrast bolus flows through the arteries of interest. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase difference or complex difference between the pair of velocity-encoded images. Phase contrast MRA techniques have been extended so that they are sensitive to velocity components in all three orthogonal directions, but this requires additional data acquisition.

Prevailing MRA techniques employ a method in which k-space is sampled along Cartesian coordinates using a 2DFT or 3DFT fast gradient recalled echo method. While the PC MRA technique does not require the injection of contrast agents into the patient, it is not used in many clinical applications because it usually requires from four to six times as long as the TOF method to acquire the NMR data for a phase contrast MRA image. This is because a separate phase image may be acquired for each axis of motion (x, y and z), and two images (with different velocity encoding) must be acquired for each axis of motion.

The phase contrast technique disclosed in U.S. Pat. No. Re 32,701 is typically used for imaging exams where functional velocity information is desired. It is not usually considered competitive with time of flight (TOF) imaging because the time required for the phase contrast examination is typically four times longer than for TOF assuming the same spatial resolution. In addition, the velocity encoding gradient first moment $M_1$ value must be separately optimized for various vessels that might be present. If the first moment $M_1$ is set high so that it is more sensitive to velocity differences, the resulting phase shift may be greater than $+\pi$ or $-\pi$ in regions where the spin velocity is high and the data aliases. The velocity at which such aliasing occurs is referred to in the art as "VENC" and high sensitivity, low noise images have a low VENC. If the VENC is set high, the sensitivity to low velocities will be small and the resulting image has a low velocity-to-noise ratio. Also, quantitative velocity information usually requires careful selection of an imaging plane perpendicular to the flow so that the in-plane image resolution can be exploited. Typically this is done using 2D slices and the resolution in the slice direction is poor.

U.S. Pat. No. 6,188,922 discloses a method called PIPR which uses undersampled projection imaging in 2-dimensions and Fourier encoding in the third dimension. This technique provides approximately the factor of four reduction in scan time required to catch up in speed with TOF imaging. However, it does not deal with the VENC selection problem or the non-isotropic spatial resolution problem. The recently developed 3D projection acquisition method called VIPR disclosed in U.S. Pat. No. 6,487,435 employs an undersampled projection in three dimensions. This provides greatly increased opportunity for speed increases beyond the hybrid PIPR technique in U.S. Pat. No. 6,188,922 and it solves the non-isotropic spatial resolution problem. However, it does not deal with the VENC selection problem.

SUMMARY OF THE INVENTION

The present invention is a method for acquiring velocity encoded NMR data using a projection reconstruction ("PR") pulse sequence in which projections are acquired at a high velocity encoding ("HIGH VENC") interleaved with projections acquired at a low velocity encoding ("LOW VENC"). It has been discovered that phase information in the phase image reconstructed from the HIGH VENC NMR data may be used to "unwrap" the aliased phase information in the phase image reconstruction from the LOW VENC NMR data, even when far fewer HIGH VENC projections are acquired. The phase information in the undersampled, HIGH VENC phase image is used to unwrap the phase information in the aliased, high velocity-to-noise ratio LOW VENC phase image.

A general object of the invention is to unwrap the phase information in a LOW VENC phase image without unduly lengthening the scan time. It has been discovered that the HIGH VENC phase image can be acquired with a fraction of the projections (e.g., one-fifth) needed for LOW VENC phase image with a resulting minimal increase in total scan time (e.g., 15%). While the HIGH VENC image is noisy due to the aggressive undersampling of k-space, the phase information therein is sufficient to unwrap the aliased LOW VENC image phase values.

Another object of the invention is to increase the velocity-to-noise ratio of a velocity encoded phase contrast image. The present invention enables a lower VENC (i.e., higher velocity sensitivity) to be used without artifacts due to phase aliasing. By acquiring additional high VENC projections any aliasing that occurs can be corrected in the high velocity-to-noise image.

GENERAL DESCRIPTION OF THE INVENTION

Figure 3:
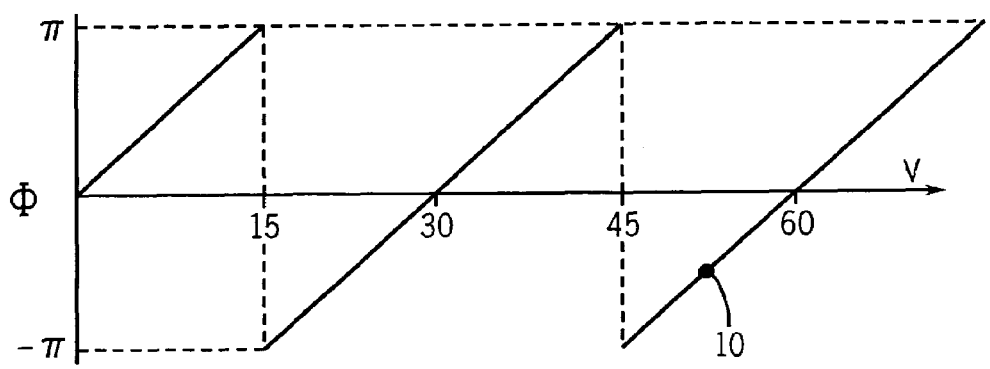
FIG. 3 is a graphic illustration of phase wrap that occurs in a velocity encoded MRI acquisition.

Referring particularly to FIG. 3, when a LOW VENC phase contrast image is acquired a large velocity encoding gradient is employed to increase the sensitivity to spin motion. If the VENC is set to 15, for example, the phase of any spins moving at less than V=15 will produce an NMR signal having a phase $\phi$ ranging between $+\pi$ or $-\pi$ radians. However, spins moving at a velocity of greater than V=15 will produce a larger phase shift in the NMR signal and the detected phase $\phi$ will wrap around to incorrectly indicate a phase shift $\phi$ between $+\pi$ or $-\pi$ radians. In the example shown in FIG. 3, a spin moving at a velocity V=50 will produce a phase shift $\phi$ in the detected NMR signal which indicates movement in the wrong direction at a low velocity as shown at point 10.

Figure 4A:
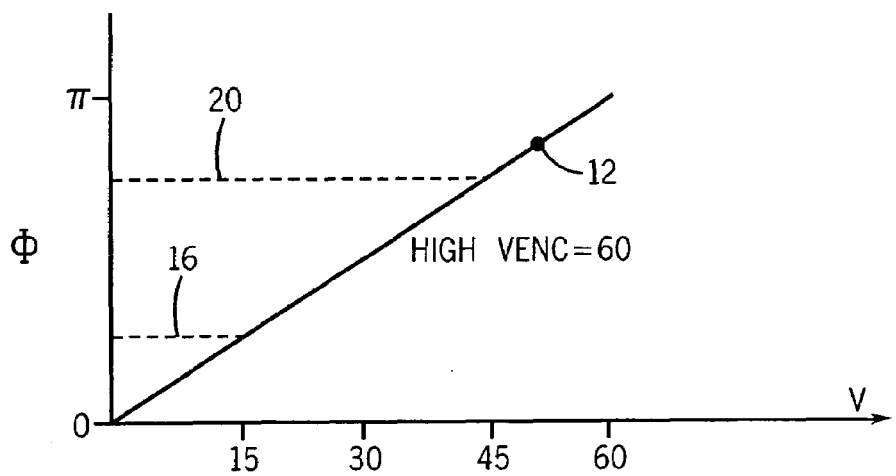
FIGS. 4A and 4B are graphic illustrations of phase information in a high VENC and a low VENC velocity encoded MRI acquisition.
Figure 4B:
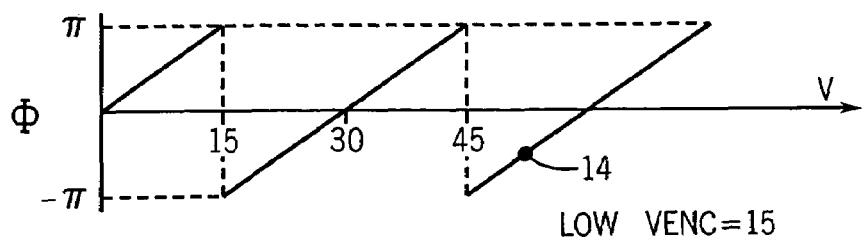

The present invention enables one to acquire an image using a LOW VENC and at the same time acquire a HIGH VENC image containing phase information that enables the aliasing in the LOW VENC image to be unwrapped. Referring particularly to FIG. 4, if a HIGH VENC image is acquired (VENC=60) a spin having a velocity of V=50 will produce an NMR signal having a phase $\phi$ of less than $\pi$ as indicated at point 12 in FIG. 4A. As explained above, the same spin will produce a signal having an aliased phase $\phi$ indicated at point 14 in FIG. 4B. As indicated by the dashed lines 16, and 20 in FIG. 4A the phase $\phi$ of the HIGH VENC acquisition can be used to unwrap the LOW VENC acquisition, where the HIGH VENC phase $\phi$ at line 16 is 1 wrap, and the phase $\phi$ at line 20 is 2 wraps. The phase information in the HIGH VENC acquisition may thus be used to determine the number of times the phase $\phi$ has wrapped in the LOW VENC acquisition. The corrected phase information in the LOW VENC acquisition may then be used to provide a high velocity-to-noise indication of spin motion.

The number of phase wraps (w) in the LOW VENC acquisition may be expressed as follows:

$$w = NI[abs\{(HIGH\ VENC/LOW\ VENC)\phi_{HIGH}\} - abs\{\phi_{LOW}\}/\pi] \quad (1)$$

where: NI=next integer function
HIGH VENC=high velocity encoding value;
LOW VENC=low velocity encoding value;
$\phi_{HIGH}$=measured HIGH VENC phase;
$\phi_{LOW}$=measured LOW VENC phase; and
abs=absolute value function.

Using this information and the LOW VENC phase information, the spin velocity may then be calculated as follows:

$$\phi_{cor} = \phi_{LOW} + w(2\pi)$$

$$V_{cor} = \phi_{cor} * LOW\ VENC/\pi. \quad (2)$$

where: $\phi_{cor}$=corrected LOW VENC phase; and
$V_{cor}$=corrected spin velocity.

The present invention recognizes that the above phase unwrapping can be accomplished by acquiring a HIGH VENC image that adds little to the total scan time. More specifically, by employing a projection reconstruction pulse sequence which samples radial trajectories in k-space, a HIGH VENC image can be acquired along with the LOW VENC image that has the same resolution, but requires substantially fewer acquisitions. It has been discovered that streak artifacts characteristic of highly undersampled projection reconstruction images do not interfere with the extraction of phase wrap information. As will be described below, by acquiring a HIGH VENC PR image with only one-fifth the number of projections acquired in the LOW VENC PR image enables the unwrap information to be extracted. This translates into a 15% to 20% increase in total scan time in a 3DPR acquisition.

DETAILED DESCRIPTION OF THE PREFERRED EMBODIMENT

Figure 1:
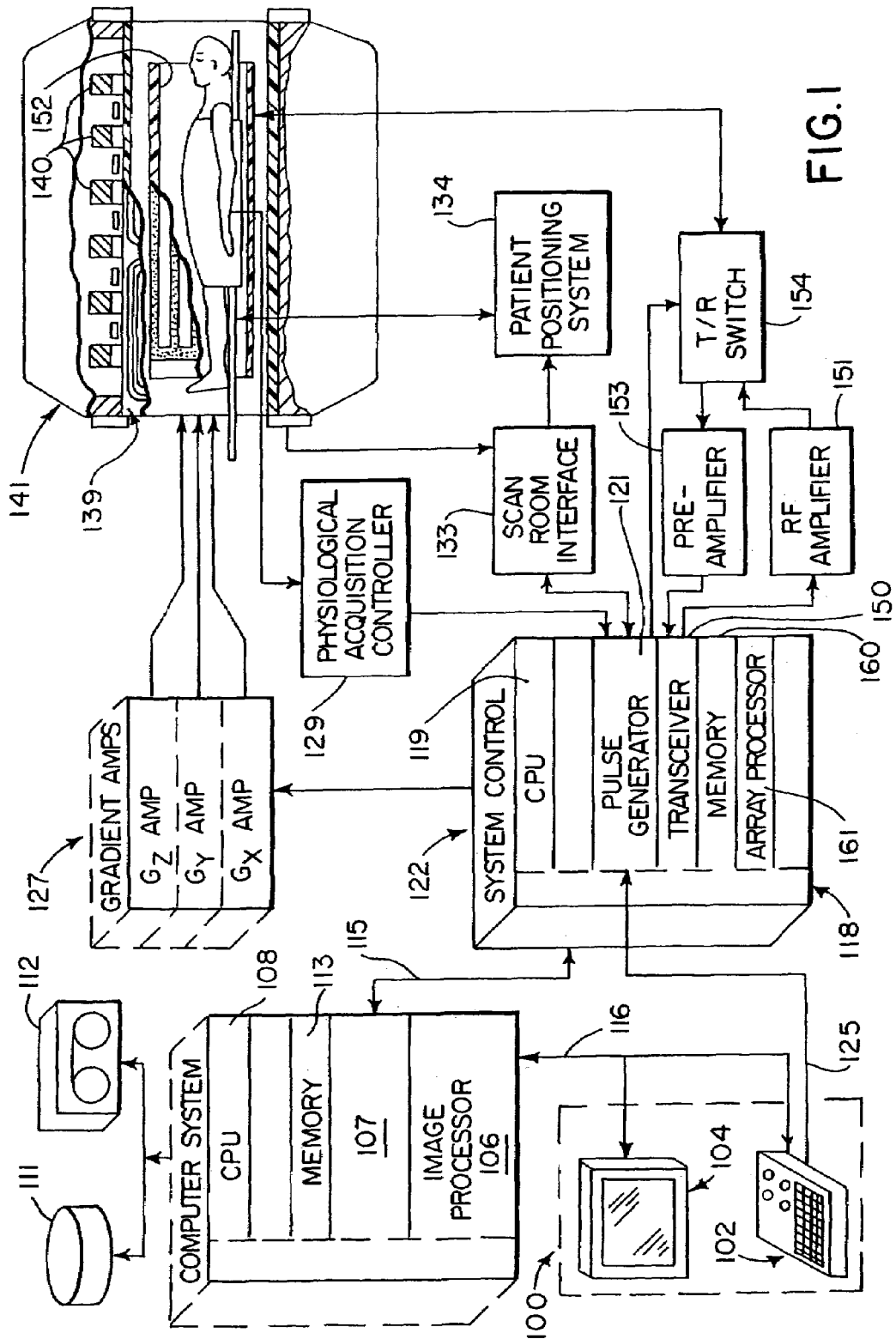
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of Gx, Gy and Gz amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a wholebody RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122 through a backplane 118. When the scan is completed and an entire array of data has been acquired in the memory module 160, an array processor 161 operates to reconstruct one or more images as will be described below. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
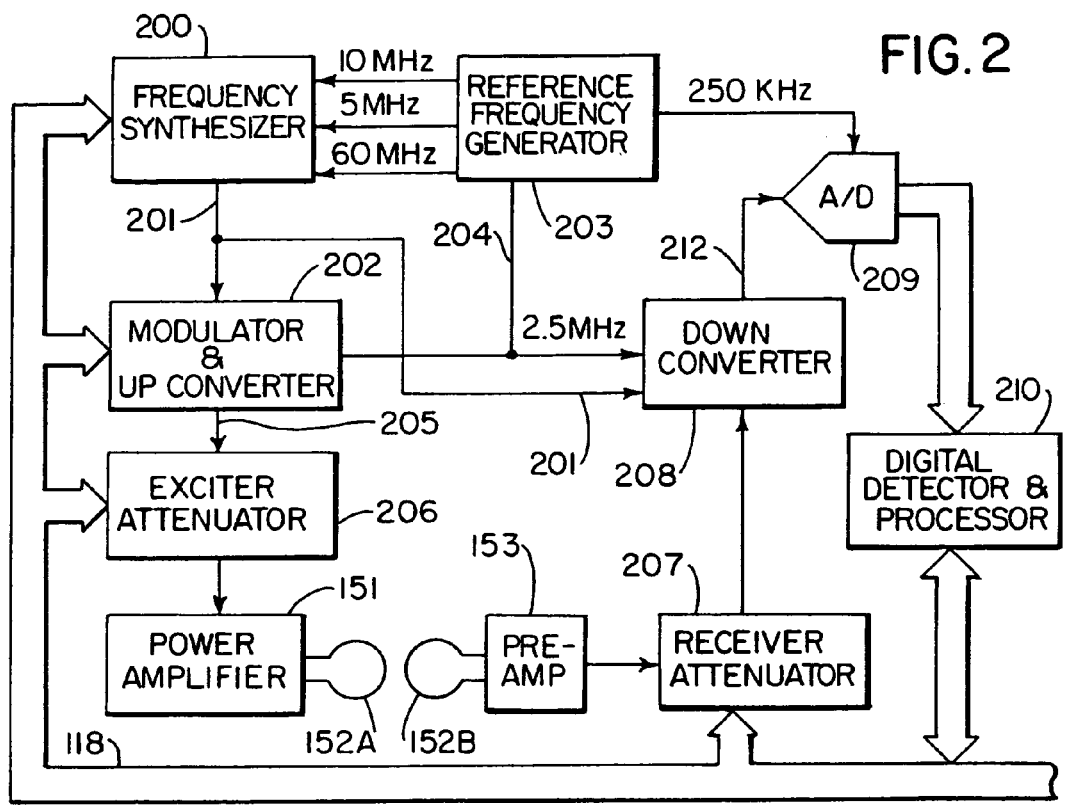
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 5:
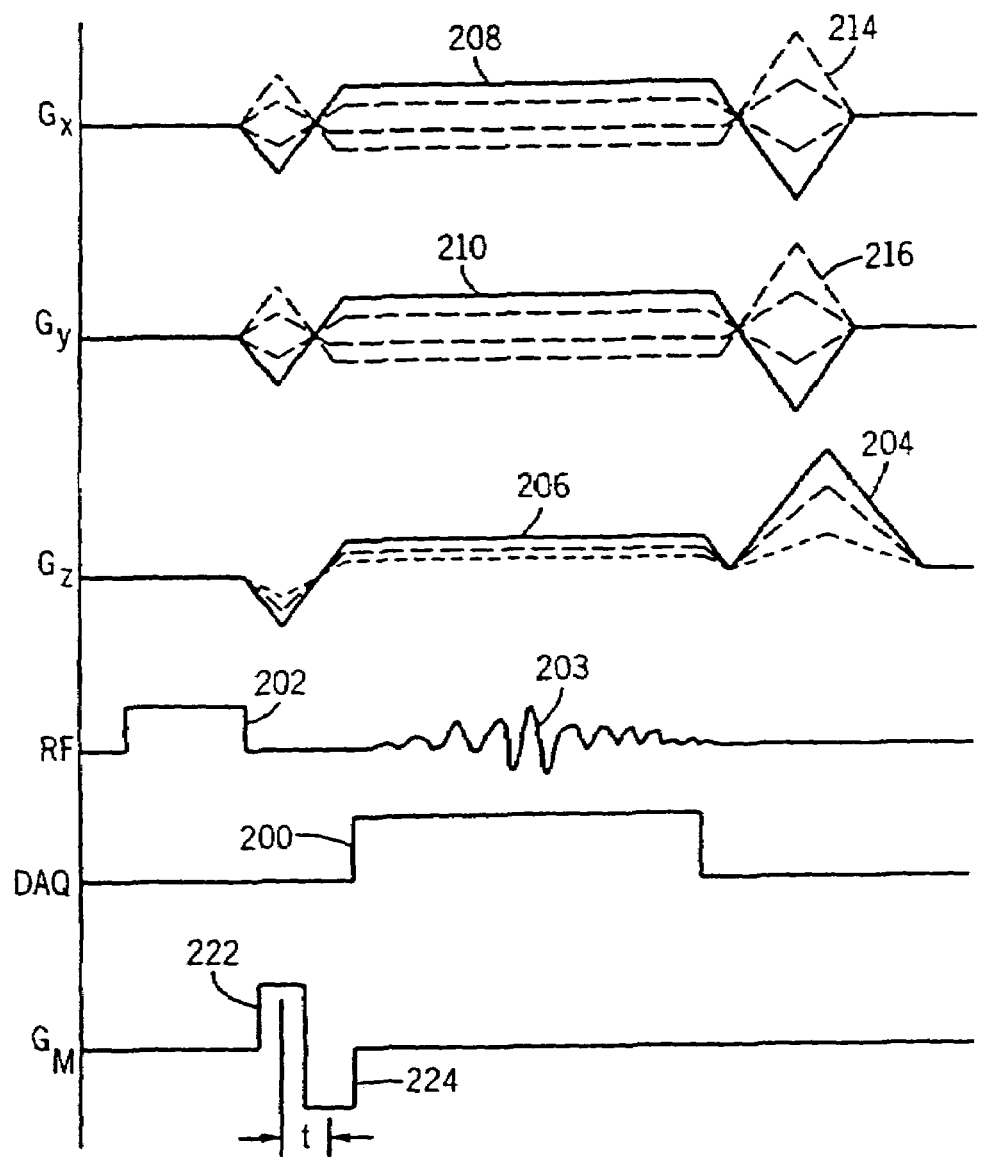
FIG. 5 is a graphic representation of the preferred pulse sequence used by the MRI system of FIG. 1 to practice the present invention.

A pulse sequence used to acquire data as 3D projections is shown in FIG. 5. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. If partial echo is chosen, the bottom half of k-space (kz<0) is only partially acquired. Because of the large FOV in all directions, a non-selective 200 ms radio-frequency (RF) pulse 202 can be used to produce transverse magnetization throughout the image FOV. Relative to slab-selective excitation use in conventional spin-warp acquisitions, this method provides a more uniform flip angle across the volume, requires lower RF power, and deposits less energy into the patient.

A gradient-recalled NMR echo signal 203 is produced by spins in the excited FOV and acquired in the presence of three readout gradients 206, 208 and 210. Since a slab-select gradient is not required, the readout gradient waveforms Gx, Gy, and Gz have a similar form. This symmetry is interrupted only by the need to spoil the sequence, which is accomplished by playing a dephasing gradient lobe 204. The area of the dephasing lobe 204 is calculated to satisfy the condition $$\int_0^{T_R} (G_{dephase}(t) + G_{read}(t))dt = n \cdot k_{max} \qquad (3)$$

where n is an integer. Because the $G_z$ readout gradient 206 is always positive on the logical z-axis, the time required for the spoiling gradient 204 is minimized by playing the dephasing lobe 204 only on $G_z$. The $G_x$ and $G_y$ readout gradients 208 and 210 are rewound by respective gradient pulses 212 and 214 to achieve steady state.

The readout gradient waveforms $G_x$, $G_y$ and $G_z$ are modulated during the scan to sample radial trajectories at different θ and φ angles. The angular spacing of θ and φ are chosen such that a uniform distribution of k-space sample points occurs at the peripheral boundary (kmax) of the sampled k-space sphere. Although several methods of calculating the distribution are known, a method which evenly distributes the projections by sampling the spherical surface with a spiral trajectory, with the conditions of constant path velocity and surface area coverage is used. This solution also has the benefit of generating a continuous sample path, which reduces gradient switching and eddy currents. For the acquisition of N total projections, the equations for the gradient amplitude as a function of projection number n are:

$$G_z = \frac{2n-1}{2N} \qquad (4)$$

-continued $$G_x = \cos\left(\sqrt{2N\pi} \sin^{-1} G_z(n)\right)\sqrt{1 - G_z(n)^2} \qquad (5)$$

$$G_y = \sin\left(\sqrt{2N\pi} \sin^{-1} G_z(n)\right)\sqrt{1 - G_z(n)^2}. \qquad (6)$$

Each projection number n produces a unique project angle and when this number is indexed from 1 to N during a scan, the spherical k-space is equally sampled along all three axes.

Referring again to FIG. 5, to produce a phase contrast MRA image, each acquired projection is motion sensitized by a bipolar motion encoding gradient $G_M$. As is well known in the art, a velocity encoding gradient $G_M$ is comprised of two gradient lobes 222 and 224 of equal size and opposite polarity. The motion encoding gradient $G_M$ can be applied in any direction and it is played out after transverse magnetization is produced by the RF excitation pulse 202 and before the NMR echo signal 203 is acquired. The motion encoding gradient $G_M$ imposes a phase shift to the NMR signals produced by spins moving in the direction of the gradient $G_M$ and the amount of this phase shift is determined by the velocity of the moving spins and the first moment of motion encoding gradient $G_M$. The first moment ($M_1$) is equal to the product of the area of gradient pulse 222 or 224 and the time interval (t) between them. It is the value of this first moment that determines the sensitivity to spin motion and the velocity at which phase wrap occurs.

To ensure that phase shifts in the acquired NMR signals 203 are due solely to spin motion, two acquisitions are often made at each projection angle and at each motion encoding gradient value $M_1$. One image acquisition is performed with the bipolar gradient $G_M$ as shown in FIG. 5 and a second image acquisition is made with the polarity of each gradient lobe 260 and 262 reversed. The two resulting phase images are subtracted to null any phase shifts common to both acquisitions. The phase shifts caused by spin motion are also reinforced due to the reversal of motion encoding gradient polarity. In the present preferred embodiment of the invention an alternative technique is used to acquire signals with motion encoding along each axis and then acquire a signal with no motion encoding. The resulting "reference" velocity image $V_0$ is subtracted from each of the motion encoded images $V_x$, $V_y$ and $V_z$ to null any phase shifts not caused by spin motion. With this method there is no reinforcement of the phase shifts due to motion, but the scan time is reduced.

As indicated above, the motion encoding gradient $G_M$ can be applied in any direction. In the preferred embodiments, the motion encoding gradient $G_M$ is applied separately along each of the gradient axes, x, y and z such that an image indicative of total spin velocity can be produced. That is, an image indicative of velocity along the z axis ($v_z$) is produced by acquiring an image with the bipolar motion encoding gradient $G_M$ added to the $G_z$ gradient waveform, a second velocity image $V_x$ is acquired with the motion encoding gradient $G_M$ added to the $G_x$ gradient waveform, and a third velocity image $V_y$ is acquired with the motion encoding gradient $G_M$ added to the $G_y$ gradient waveform. An image indicative of the total spin velocity is then produced by combining the corresponding pixel values in the three velocity images $$V_T = \sqrt{V_x^2 + V_y^2 + V_z^2}. \qquad (7)$$

Figure 6:
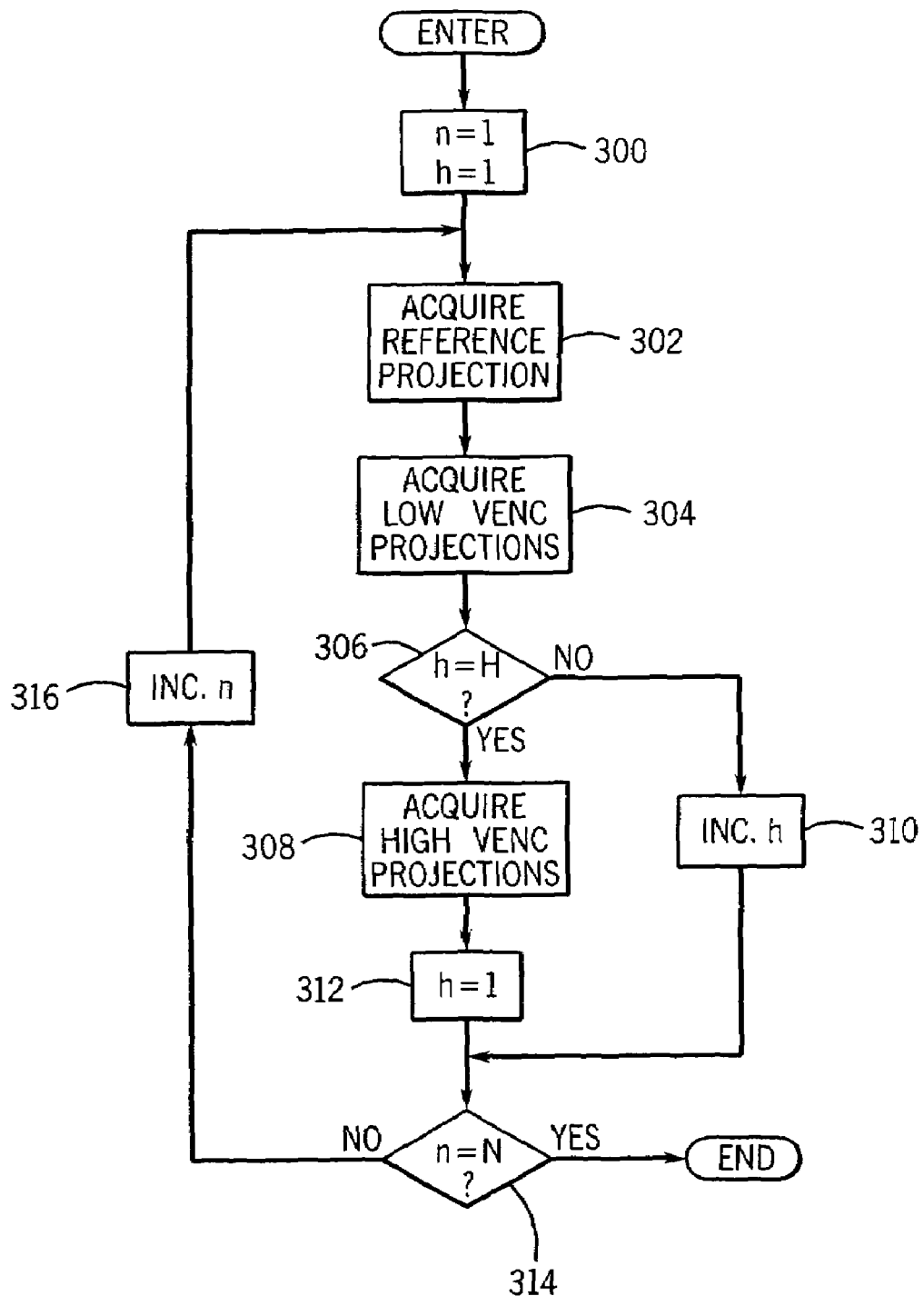
FIG. 6 is a flow chart illustrating a preferred method for acquiring data in a constant flow clinical situation.

The method used to acquire data depends on the nature of the motion being imaged. The acquisition method used in cases of constant flow, where there is only one velocity associated with each voxel is depicted in FIG. 6. Two indexes n and h are initialized to 1 as indicated at process block 300, and a loop is entered until n=N LOW VENC projections are acquired. As indicated at process block 302, a reference projection is acquired with velocity encoding set to zero, and then three LOW VENC projections are acquired at process block 304 with velocity encoding directed along the respective x, y and z gradient axes as described above. The LOW VENC value is set for the desired velocity sensitivity (e.g., 15) and the imaging gradients $G_x$, $G_y$ and $G_z$ are determined by the above equations (4), (5) and (6) and the value of index n.

A test is then made at decision block 306 to determine if it is time to acquire projections for the HIGH VENC image. This is determined by the value of the index h which counts the number of LOW VENC projections between HIGH VENC projections. In the preferred embodiment H is set to 5 so that after every fifth LOW VENC acquisition a HIGH VENC acquisition is performed. As indicated at process block 308 three velocity encoded projections $V_x$, $V_y$ and $V_z$ are acquired at the selected HIGH VENC value (e.g., 60), and the same imaging gradients $G_x$, $G_y$ and $G_z$ used for the most recent LOW VENC acquisitions are used. The index h is incremented at 310 if a HIGH VENC acquisition is not done, otherwise, it is reset to 1 at process block 312. The index n is examined at decision block 314 to determine if the scan is completed, and if it is not, the index n is incremented at process block 316 and the system loops back to acquire the next projections.

The constant flow scan depicted in FIG. 6 produces seven k-space data sets. Three k-space data set $k_{xLOW}$, $k_{yLOW}$ and $k_{zLOW}$ are sampled with N projections. A fourth reference k-space data set $k_o$ is also sampled with N projections. The fifth, sixth and seventh k-space data sets $k_{xHIGH}$, $k_{yHIGH}$ and $k_{zHIGH}$ are velocity encoded at HIGH VENC and they are highly under sampled with a total of N/H projections. The LOW and HIGH VENC data sets that result from this acquisition method sample k-space substantially uniformly about the origin of k-space, and the timing of the HIGH VENC acquisitions are interleaved with the timings of the LOW VENC acquisitions.

In clinical applications where the velocity of spin flow changes during the acquisition of data, gating is used to acquire the LOW VENC, HIGH VENC and reference k-space data sets at specific moments during the cardiac cycle. Since HIGH VENC projections must be acquired at the same cardiac phase as corresponding LOW VENC projections, this means that HIGH VENC projections are acquired in different cardiac cycles than corresponding LOW VENC projections.

Figure 7:
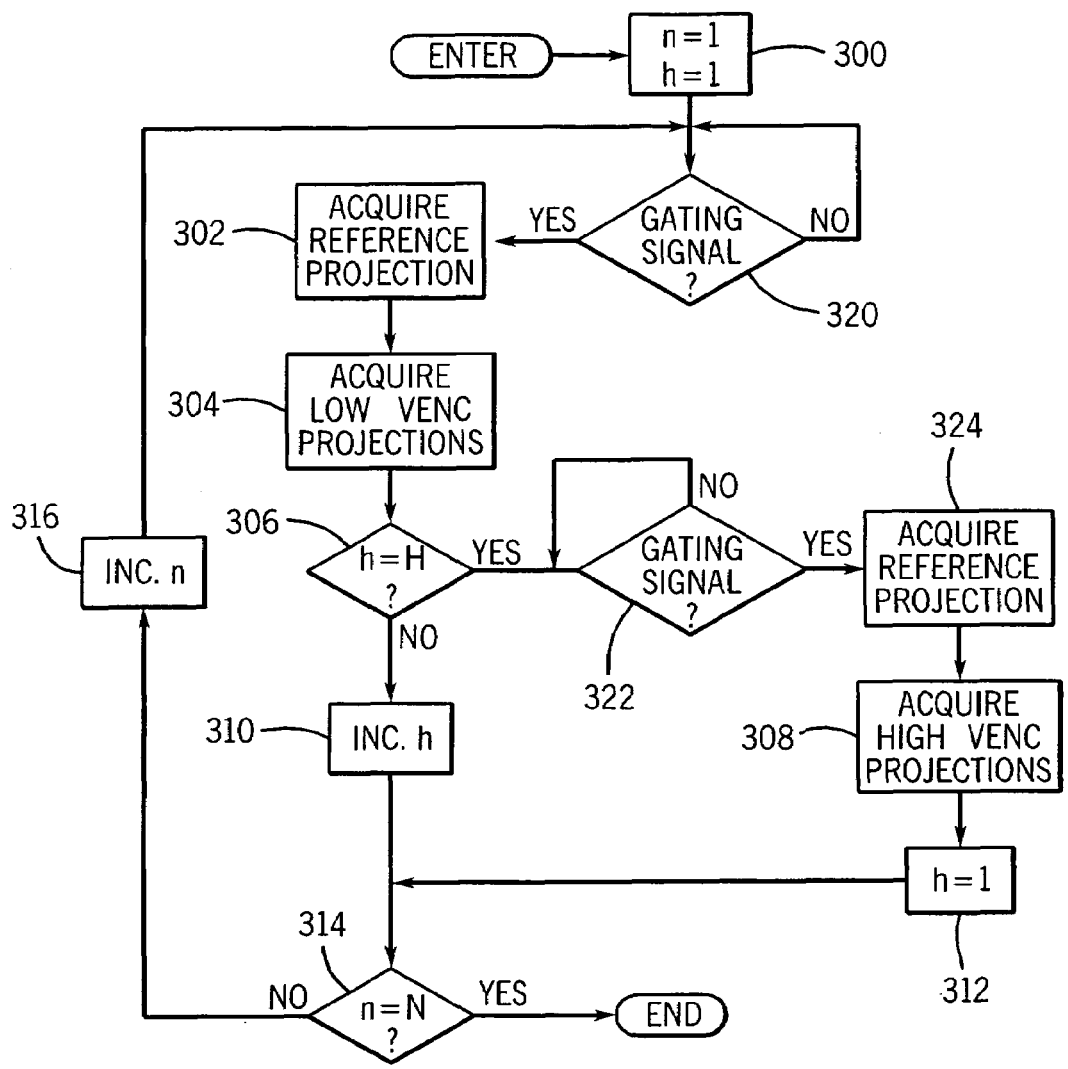
FIG. 7 is a flow chart illustrating a preferred method for acquiring data using cardiac gating.

A cardiac gated acquisition method for accomplishing this is illustrated in FIG. 7, where steps that are the same as in the constant flow method described above are indicated with like reference numbers. A primary difference is that the process pauses at decision block 320 to await a gating signal prior to each LOW VENC acquisition. Also, when a HIGH VENC acquisition is to occur as indicated at decision block 306, the system pauses to await the next gating signal as indicated at decision block 322. Because the reference projection should be acquired during the same heartbeat as the HIGH VENC projections, an addition set of reference projections are acquired as indicated at process block 324. In other words, the reference projections acquired at process block 302 are only used to correct phase in LOW VENC images. This increases total acquisition time slightly, however, total scan time is increased significantly in any event due to the time spent waiting for gating signals.

It can be appreciated by those skilled in the art that when the gated acquisition method is used, more than one set of eight k-space data sets may be acquired to depict the subject at different phases of cardiac cycle. In other words, one set of eight k-space data sets may be acquired soon after the gating signal is produced and other k-space data sets maybe acquired later in the cardiac cycle.

Figure 8:
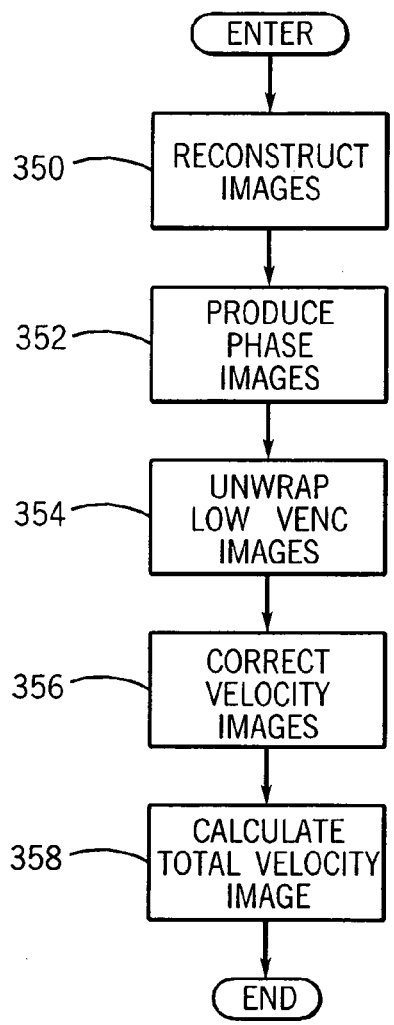
FIG. 8 is a flow chart illustrating the preferred method for reconstructing a velocity image using the acquired data.

Referring particularly to FIG. 8, after the k-space data sets are acquired with one of the above acquisition methods they are processed to produce a velocity image. The first step is to reconstruct an image from each k-space data set as indicated at process block 350. While a number of techniques may be used, in the preferred embodiment the projection k-space data in each set is regridded onto a 3D Cartesian grid and then a complex, 3D Fourier transformation is performed on the regridded k-space data set. Such regridding methods are well known in the art and is described, for example, in J. Jackson et al, "Selection Of Convolution Function For Fourier Inversion Using Gridding," *IEEE Trans. Med. Imaging*, 10, 473–478, 1991. Each resulting 3D array of k-space data are density compensated with a $\rho^2$ filter, where $\rho$ is the k-space radius of the data pint being compensated. The $\rho=0$ point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

The next step as indicated by process block 352 is to produce a phase image from each resulting 3D complex image data set $I_{xLOW}$, $I_{yLOW}$, $I_{zLOW}$, $I_{xHIGH}$, $I_{yHIGH}$, $I_{zHIGH}$ and $I_0$. This is done by calculating the phase $\phi$ at each image pixel from its complex I and Q values:

$$\phi = \tan^{-1} I/Q. \tag{8}$$

Phase shifts caused by factors other than spin motion are then subtracted out by subtracting the reference phase. This procedure is done for both the HIGH VENC and the LOW VENC velocity images.

$$V_{xLOW} = \phi_{xLOW} - \phi_0 (LOW\ VENC/\pi)$$

$$V_{yLOW} = \phi_{yLOW} - \phi_0 (LOW\ VENC/\pi) \tag{9}$$

$$V_{zLOW} = \phi_{zLOW} - \phi_0 (LOW\ VENC/\pi)$$

$$V_{xHIGH} = \phi_{xHIGH} - \phi_0 (HIGH\ VENC/\pi)$$

$$V_{yHIGH} = \phi_{yHIGH} - \phi_0 (HIGH\ VENC/\pi)$$

$$V_{zHIGH} = \phi_{zHIGH} - \phi_0 (LOW\ VENC/\pi)$$

As indicated by process block 354, the next step is to correct the LOW VENC velocity images $V_{xLOW}$, $V_{yLOW}$ and $V_{zLOW}$ for phase wrap using information in the HIGH VENC velocity images $V_{xHIGH}$, $V_{yHIGH}$ and $V_{zHIGH}$. For each image pixel the number of phase wraps (w) is calculated using corresponding LOW VENC and HIGH VENC phase values and the above equation (1), and then the unwrapped phase value, or velocity V is calculated using the above equation (2). The result is three unwrapped velocity images $V_x$, $V_y$ and $V_z$.

Because errors can occur during this unwrapping step a number of corrective steps are taken as indicated by process block 356. More specifically, the phase of each image pixel is compared with that of its 26 nearest neighbors, and if more than 13 of those neighbors show a consistent number of phase wraps different than the pixel, the pixel phase is corrected to have this consistent number of phase wraps. This process is performed on each pixel in the phase image and then the process is repeated two or three times. Then, the phase of each image pixel is compared with that of its six nearest neighbors. If more than three of the neighbors have a consistent number of phase wraps different than that of the pixel, correction is made. After all the pixels have been processed, the procedure is repeated two or three times.

And finally, as indicated at process block 358 the total velocity image V is calculated by calculating the square root of the sum of the squares of the three corrected velocity images $V_x$, $V_y$ and $V_z$:

$$V = \sqrt{V_x^2 + V_{xy}^2 + V_z^2}. \qquad (10)$$

The production of an anatomical image using the velocity image V can be done simply by multiplying the absolute value of the phase value at each pixel in the velocity image V by the magnitude of the NMR signal at that pixel. The magnitude values $M = \sqrt{I^2 + Q^2}$ can be calculated using the previously reconstructed reference image $I_0$ which contains no velocity encoding. Unfortunately, this multiplication method has a poor, nonlinear response to partial volume effects which cause an underestimation of velocity.

An alternative strategy which addresses this problem is to produce a complex difference image which has a linear response to partial volume effects. Implementing a complex difference method is not, however, easy when dual VENC data is acquired. The complex difference of dual VENC data is found using a modified law of cosine calculation. The cosine function is replaced by a function which is non periodic. The general modified complex difference function is defined to be:

$$CD(r) = \sqrt{?mag(r)?^2 + ?V(r)?^2 - 2 \cdot ?mag(r)? \cdot ?V(r)? \cdot w(\phi)} \qquad (11)$$

Where the variables are defined to be:
  r=a single voxel in the reconstructed image
  mag(r)=the magnitude of the signal from a voxel at position r, with no velocity encoding
  V(r)=the value of the signal from a voxel at position r in the velocity image V
  w($\phi$)=the function replacing a cosine function evaluated at a position r (weighting function).

The complex difference calculation is performed on each pixel in the velocity image V to produce a phase contrast image.

Figure 9:
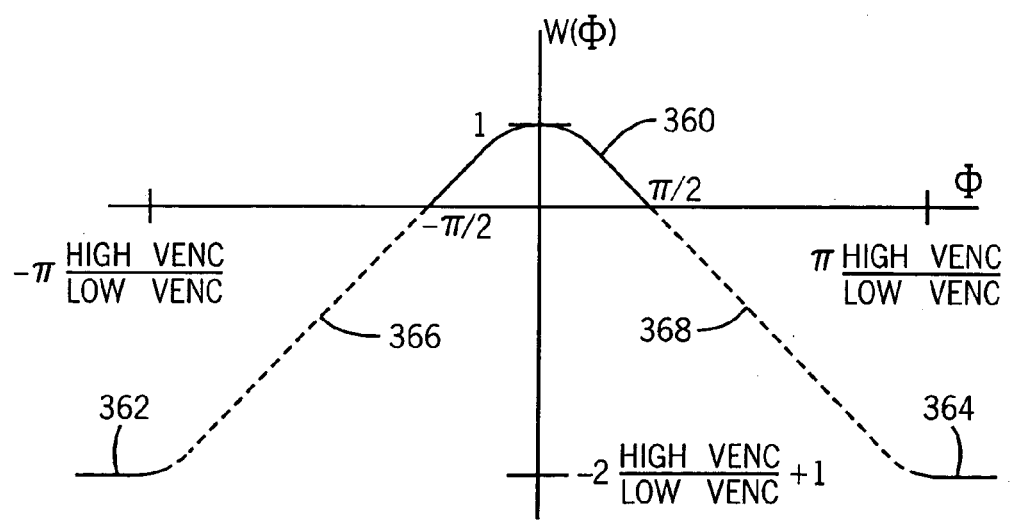
FIG. 9 is a graphic illustration of a weighting function used to produce a velocity image.

The weighting function image w($\phi$) used in the above process is calculated once and the values therein are stored in a look-up table for use with dual VENC velocity images acquired with the same HIGH VENC/LOW VENC ratio. One such weighting function is calculated by setting w($\phi$) to cos($\phi$) for values of $\phi$ between $-\pi/2$ and $+\pi/2$, setting w($\phi$) to $-(2$ HIGH VENC/LOW VENC$)+1$ for absolute values of $\phi$ greater than $\pi$ HIGH VENC/LOW VENC, and interpolating the missing regions therebetween using spline interpolation. This is illustrated in FIG. 9 where the line segment 360 is the cos($\phi$) segment, the line segments 362 and 364 are the constant values when the absolute value of $\phi$ is very large, and the dotted lines 366 and 368 are the interpolated values therebetween. The values of $\phi$ in this weighting function calculation is the value in the velocity image V at the pixel r.

The invention claimed is:

1. A method for producing an image with a magnetic resonance imaging (MRI) system, the steps comprising:
  a) acquiring a LOW VENC series of NMR signals using a pulse sequence having a first motion encoding gradient field with a first moment that imparts a phase shift in the NMR signals indicative of spin motion, the pulse sequence having a readout gradient that is rotated from one pulse sequence to the next such that the LOW VENC series of NMR signals sample k-space at a corresponding first series of different projection angles;
  b) acquiring a HIGH VENC series of NMR signals using a pulse sequence having a second motion encoding gradient field with a first moment that is substantially less than the first moment in step a) and that imparts a phase shift in the NMR signals indicative of spin motion, the pulse sequence having a readout gradient that is rotated from one pulse sequence to the next such that the HIGH VENC series of NMR signal sample k-space at a corresponding second series of different projection angles;
  c) reconstructing a LOW VENC image from the series of NMR signals acquired in step a);
  d) producing a LOW VENC phase image from the LOW VENC image reconstructed in step c);
  e) reconstructing a HIGH VENC image from the series of NMR signals acquired in step b);
  f) producing a HIGH VENC phase image from the HIGH VENC image reconstruction in step e); and
  g) correcting the LOW VENC phase image using phase information in the HIGH VENC phase image.

2. The method as recited in claim 1 in which the number of acquired HIGH VENC NMR signals is substantially less than the number of acquired LOW VENC NMR signals.

3. The method as recited in claim 1 in which the acquisition of HIGH VENC NMR signals in step b) is interleaved in time with the acquisition of LOW VENC NMR signals in step a).

4. The method as recited in claim 1 in which the number of acquired HIGH VENC NMR signals is less than one-half the number of acquired LOW VENC NMR signals.

5. The method as recited in claim 4 in which the number of acquired HIGH VENC NMR signals is substantially one-fifth the number of acquired LOW VENC NMR signals.

6. The method as recited in claim 1 which includes:
  h) producing a second corrected LOW VENC phase image by repeating steps a) through g) using motion encoding gradient fields in steps a) and b) which are oriented in a second direction that is different than the direction used to produce the first corrected LOW VENC phase image;
  i) producing a velocity image by combining the two corrected LOW VENC phase images.

7. The method as recited in claim 6 which includes:
  j) producing a third corrected LOW VENC phase image by repeating steps a) through g) using motion encoding gradient fields in steps a) and b) which are oriented in a third direction that is different than the directions used to produce the first and second corrected LOW VENC phase images; and
  the velocity image is produced in step i) by combining all three corrected LOW VENC phase images.

8. The method as recited in claim 6 which includes:
  acquiring a series of reference NMR signals using the pulse sequence of steps a) and b) without a motion encoding gradient field;

reconstructing a magnitude image from the acquired reference NMR signals; and producing a phase contrast image in which the value of each pixel therein is calculated as $$CD(r) = \sqrt{|mag(r)|^2 + |V(r)|^2 - 2\cdot|mag(r)|\cdot|V(r)|\cdot w(\phi)}$$

where:

r=a single pixel in the reconstructed phase contrast image;

mag(r)=the magnitude of the signal from pixel r in the magnitude image;

V(r)=the value of the signal from a pixel at position r in the velocity image; and w($\phi$)=a weighting function evaluated at position r.

9. The method as recited in claim 8 in which the weighting function w($\phi$) is a set of values stored in a look-up table and it is evaluated by looking up a value stored in the look-up table using the value of the signal from pixel r in the velocity image.

\* \* \* \* \*

UNITED STATES PATENT AND TRADEMARK OFFICE
CERTIFICATE OF CORRECTION

PATENT NO.       : 7,049,816 B2
APPLICATION NO.  : 10/955816
DATED            : May 23, 2006
INVENTOR(S)      : Mistretta et al.

It is certified that error appears in the above-identified patent and that said Letters Patent is hereby corrected as shown below:

Column 8, line 64, Eq. (7), " $V_T = \overline{V_x^2 + V_y^2 + V_z^2}$ " should be -- $V_T = \sqrt{V_x^2 + V_y^2 + V_z^2}$ --.

Column 11, line 16, Eq. (10), " $V_T = \overline{V_x^2 + V_y^2 + V_z^2}$ " should be -- $V_T = \sqrt{V_x^2 + V_y^2 + V_z^2}$ --.

Column 11, line 23, " $M = \overline{I^2 + Q^2}$ " should be -- $M = \sqrt{I^2 + Q^2}$ --.

Column 11, line 38, Eq. (11),

" $CD(r) = \sqrt{?mag(r)?^2 + ?V(r)?^2 - 2 \cdot ?mag(r)? \cdot ?V(r)? \cdot w(\phi)}$ "

should be -- $CD(r) = \sqrt{|mag(r)|^2 + |V(r)|^2 - 2 \cdot |mag(r)| \cdot |V(r)| \cdot w(\phi)}$ --.

Claim 8, column 13, line 5,

" $CD(r) = \sqrt{?mag(r)?^2 + ?V(r)?^2 - 2 \cdot ?mag(r)? \cdot ?V(r)? \cdot w(\phi)}$ "

should be -- $CD(r) = \sqrt{|mag(r)|^2 + |V(r)|^2 - 2 \cdot |mag(r)| \cdot |V(r)| \cdot w(\phi)}$ --.

Signed and Sealed this

Seventeenth Day of October, 2006

JON W. DUDAS
*Director of the United States Patent and Trademark Office*